(12) United States Patent
Hu

(10) Patent No.: US 7,705,456 B2
(45) Date of Patent: Apr. 27, 2010

(54) SEMICONDUCTOR PACKAGE SUBSTRATE

(75) Inventor: Wen-Hung Hu, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 0 days.

(21) Appl. No.: 12/276,477

(22) Filed: Nov. 24, 2008

(65) Prior Publication Data

US 2009/0134515 A1 May 28, 2009

(30) Foreign Application Priority Data

Nov. 26, 2007 (TW) ................................ 96144703 A

(51) Int. Cl.
*H01L 23/498* (2006.01)
(52) U.S. Cl. ................ 257/737; 257/774; 257/E23.068
(58) Field of Classification Search ................ 257/737, 257/E23.068, 750, 774, 778
See application file for complete search history.

(56) References Cited

U.S. PATENT DOCUMENTS 6,662,443 B2 * 12/2003 Chou et al. .................... 29/852
6,809,262 B1    10/2004 Hsu

* cited by examiner

*Primary Examiner*—Roy K Potter
(74) *Attorney, Agent, or Firm*—Pearne & Gordon LLP

(57) ABSTRACT

A semiconductor package substrate includes a main body with a surface having a first circuit layer thereon and a dielectric layer covering the first circuit layer, with a plurality of vias on a portion of the first circuit layer; a plurality of first conductive vias disposed in the vias; a plurality of first electrically connecting pads on the first conductive vias and completely exposed on the dielectric layer having no extending circuits for a semiconductor chip to be mounted thereon, the first electrically connecting pad being electrically connected to the first circuit layer of the first conductive via; and an insulating protective layer disposed on the main body with an opening for completely exposing the first electrically connecting pads, whereby the circuit layout density is increased without disposing circuits between the electrically connecting pads.

7 Claims, 4 Drawing Sheets

SEMICONDUCTOR PACKAGE SUBSTRATE

BACKGROUND OF THE INVENTION

1. Technical Field

The present invention relates to semiconductor package substrates, and more particularly, to first electrically connecting pads of a semiconductor package substrate for fine pitch application and enhanced bonding of semiconductor chips.

2. Description of Related Art

In flip-chip technology, electrode pads are formed on the IC semiconductor chip and an organic circuit board also has electrically connecting pads corresponding to the electrode pads in position. Solder structures or other conductive adhesive materials are formed between the electrode pads and the circuit boards for providing electrical and physical connections between the semiconductor chip and the circuit board. Related technology is disclosed in U.S. Pat. No. 6,809,262 (TW Patent No. 572361).

Referring to FIGS. 1A and 1B, a circuit layer 11 is formed on at least one surface of a substrate main body 10. The circuit layer 11 comprises a plurality of electrically connecting pads 110 and circuits 112, and portions of the circuits 112 are electrically connected with the electrically connecting pads 110 and thus electrically connected to the internal circuits (not shown in the drawings). Moreover, an insulative protective layer 13 is formed on the substrate main body 10, having an opening 130 for exposing the electrically connecting pads 110 and portions of the circuits 112, in which an solder layer 14 made of solder is formed on the exposed circuits 112 and electrically connecting pads 110, so as to avoid oxidation or provide an electrical connecting means for other electrical devices.

Referring to FIG. 2, a semiconductor chip 20 is mounted on the electrically connecting pads 110 in the opening 130 of the insulative protective layer 13. The semiconductor chip 20 has a plurality of electrode pads 21 each formed with a bump 22, allowing the bump 22 to be electrically connected to a solder layer 14 on each electrically connecting pad 110 correspondingly, so as to reduce the overall height of the package. Moreover the opening 130 is filled with an underfill 23, and since the aperture of the opening 130 is sufficiently large to expose a plurality of electrically connecting pads 110 and accommodate the underfill 23 without resulting in a flash incidence.

However, the electrically connecting pads 110 extend sideward to the circuits 112 as shown in FIG. 1A, preventing the bumps 22 of the semiconductor chip 20 from completely covering the electrically connecting pads 110 as shown in FIG. 2. Hence, a circuit-extending portion of the electrically connecting pads 110 is susceptible to concentration of stress, thus leading to cracking of the bumps 22 and poor bonding between the bumps 22 and the electrically connecting pads 110.

Moreover, a circuit 112 is formed between two adjacent electrically connecting pads 110, which lengthen the distance between the two adjacent electrically connecting pads 110. As the distance between two adjacent electrically connecting pads 110 cannot be reduced, fine pitch application is unavailable.

Thus, there is an urgent need to develop a semiconductor substrate in which the problem that the electrically connecting pads cannot be completely covered by the bumps of the semiconductor chips is solved, and the pitch distance between two electrically connecting pads can be reduced for fine pitch application.

SUMMARY OF THE INVENTION

In view of the drawbacks of the prior art, a primary objective of the present invention is to provide a semiconductor package substrate for enhancing the bonding strength between the semiconductor chips and the semiconductor package substrate after the reflow process.

Another objective of the present invention is to provide a semiconductor package substrate for increasing the layout density of the electrically connecting pads and providing a finer pitch.

In order to achieve the foregoing objective and other objectives of the present invention, the semiconductor package substrate proposed by the present invention comprises: a main body with at least a surface having a first circuit layer thereon and a dielectric layer covering the first circuit layer, wherein the dielectric layer has a plurality of vias at a portion of the first circuit layer; a plurality of first conductive vias formed in the vias; a plurality of first electrically connecting pads formed correspondingly in positions on the first conductive vias, completely exposed from the dielectric layer without having extending circuits for a semiconductor chip to be mounted thereon, allowing the first electrically connecting pads to be electrically connected to the first circuit layer via the conductive vias; and an insulative protective layer formed on the main body, having an opening to exposed the first electrically connecting pads.

The semiconductor package substrate further comprises an adhesive layer formed on the first electrically connecting pads. The adhesive layer is made of either immersion tin completely covering the first electrically connecting pads or printed tin formed on the first electrically connecting pads. The semiconductor package substrate further comprises a semiconductor chip having a plurality of bumps corresponding in position to the first electrically connecting pads for electrically connecting with the first electrically connecting pad, allowing the bumps and the adhesive layer to fuse together. The semiconductor package substrate further comprises an underfill filled in the opening of the insulative protective layer and formed between the semiconductor chip and the dielectric layer.

Also, a second circuit layer is formed on the first electrically connecting pad-formed surface of the main body. The second circuit layer is covered by the insulative protective layer. A plurality of insulative protective layer openings are formed in the insulative protective layer to expose a portion of the second circuit layer. The exposed portion of the second circuit layer functions as second electrical connection pads. The second circuit layer is electrically connecting to the first circuit layer via the second conductive vias in the dielectric layer. Fabricating of the first conductive vias, second conductive vias, and first electrically connecting pads comprises: forming a conductive layer on the dielectric layer, and in the vias and a portion of the surface of the first circuit layer; and forming a resist layer on the conductive layer with a plurality of openings to expose a portion of the surface of the conductive layer formed on the dielectric layer and in the vias; forming first and second conductive vias in the vias of the dielectric layer to electrically connecting with the first circuit layer and forming first electrically connecting pads and a second circuit layer on the conductive layer in the opening of the resist layer; and removing the resist layer and the conductive layer covered thereby.

Accordingly, the fabrication of the semiconductor package structure of the present invention involves forming first electrically connecting pads on the dielectric layer of the substrate body, using the first conductive vias in the dielectric layer to electrically connect with the first circuit layer, allowing the first electrically connecting pads to be completely exposed from the dielectric layer without having extending circuits, followed by a reflow process on the adhesive layer to allow the bumps of the semiconductor chip and the adhesive layer to fuse together and completely cover the first electrically connecting pads, so as to enhance the bonding strength between the semiconductor chip and the first electrically connecting pads, as well as to avoid incomplete coverage resulting in stress concentration. Moreover, since there is no circuits being disposed between the first electrically connecting pads, it is feasible to elevate the density of the first electrically connecting pads being disposed, thus is preferred for fine-pitch electrical connection.

BRIEF DESCRIPTION OF THE DRAWINGS

The present invention can be more fully understood by reading the following detailed description of the preferred embodiments, with reference made to the accompanying drawings, wherein:

FIG. 3G' is a cross-sectional view of another embodiment of FIG. 3G; and

DETAILED DESCRIPTION OF THE PREFERRED EMBODIMENTS

First Preferred Embodiment

FIGS. 3A to 3G, and 4 are cross-sectional views of fabrication of a semiconductor package of the present invention.

Figure 1A:
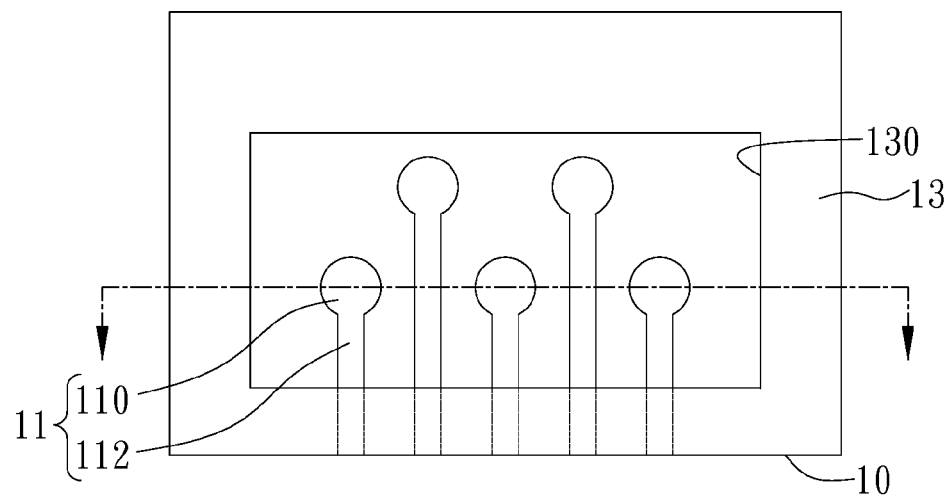
FIGS. 1A and 1B are a top view and a cross-sectional view of the semiconductor package of U.S. Pat. No. 6,809,262, respectively.
Figure 1B:
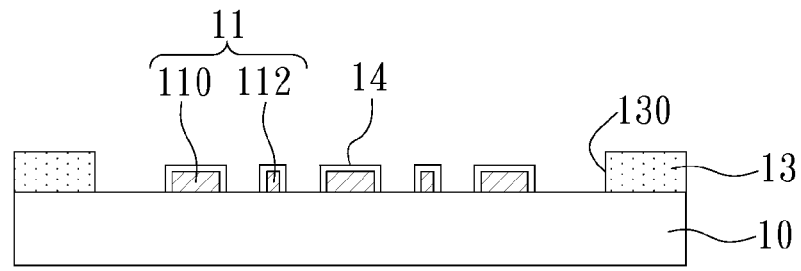
Figure 2:
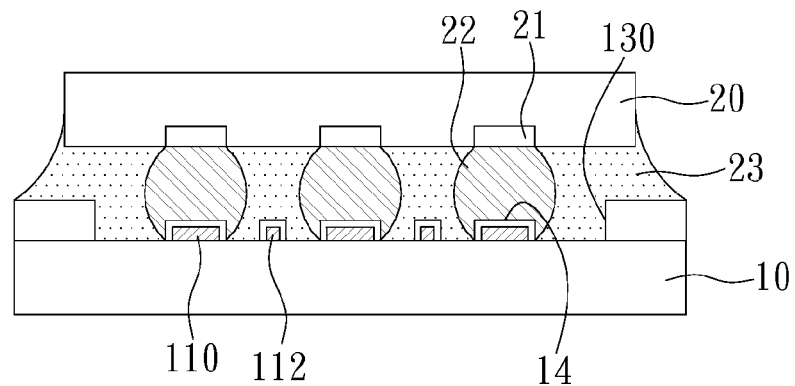
FIG. 2 is a cross-sectional view of a semiconductor package mounted with a semiconductor chip of U.S. Pat. No. 6,809,262.
Figure 3A:
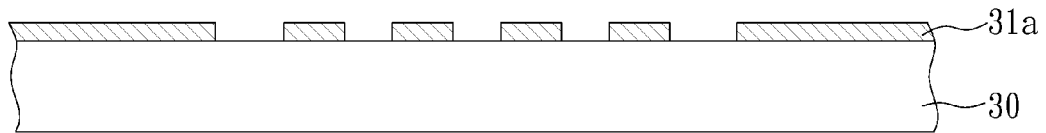
FIGS. 3A to 3G are cross-sectional views which illustrate fabrication of a semiconductor package of the present invention.

Referring to FIG. 3A, a main body 30 with at least a surface having a first circuit layer 31a thereon is provided.

Figure 3B:
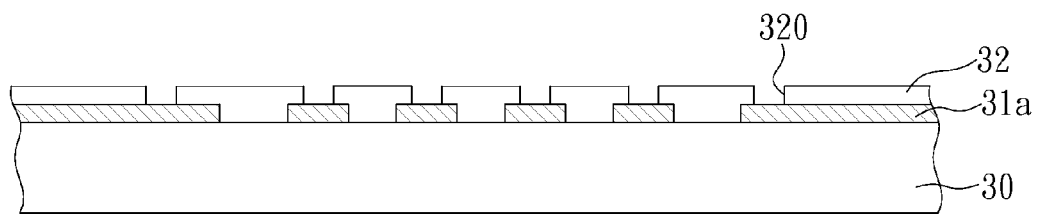

Referring to FIG. 3B, a dielectric layer 32 is formed on the main body 30 and the first circuit layer 31a, and a plurality of vias 320 are formed in the dielectric layer 32 for exposing a portion of the surface of the first circuit layer 31a.

Figure 3C:
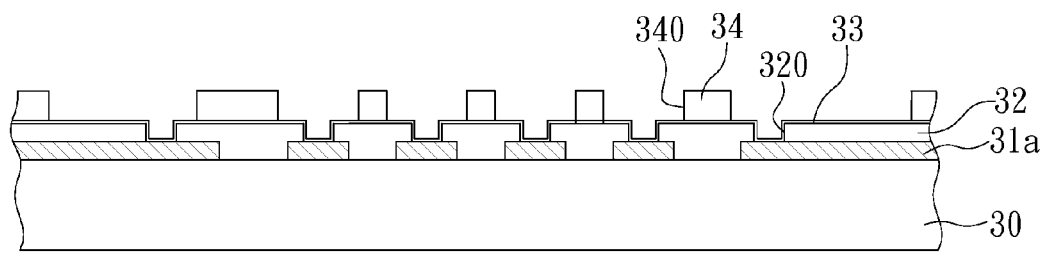

Referring to FIG. 3C, a conductive layer 33 is formed on the dielectric layer 32, in the vias 320 and on a portion of the surface of the first circuit layer 31a using sputtering or chemical deposition such as electroless plating. The conductive layer 33 functions as a path whereby the electric current passes an electroplating metal material (described below) and is formed of metal, alloy, or several deposited layers of metal layers, such as copper, tin, nickel, chromium or copper-chromium alloy. Alternatively, the conductive layer 33 is made of conductive polymer materials, such as plyacetylene, polyaniline or organic sulfur compounds. Next, a resist layer 34 is formed on the conductive layer 33. The resist layer 34 is a dry film or a photoresist layer, which is formed on the conductive layer by printing, spinning or spinning method and then the resist layer is patterned by exposure and development so as to form a plurality of resist openings 340 to expose a portion of the surface of the conductive layer 33 formed on the dielectric layer 32 and in the vias 320.

Figure 3D:
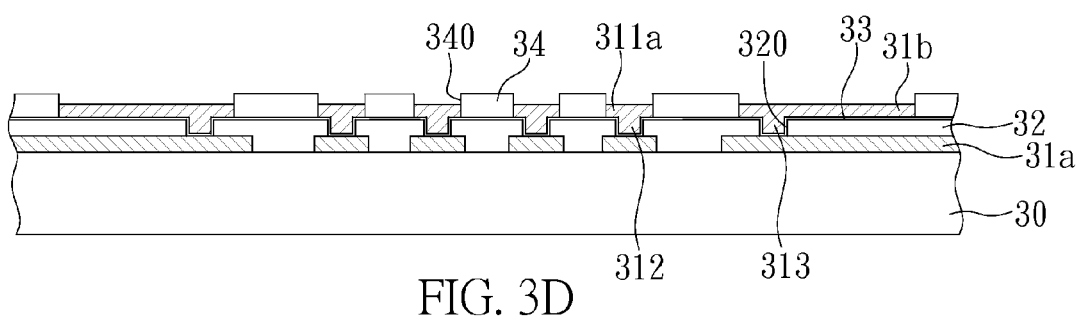

Referring to FIG. 3D, a first conductive via 312 and a second conductive via 313 are formed in the vias 320 of the dielectric layer 32, and a second circuit layer 31b and a plurality of first electrically connecting pads 311a are formed in the resist opening 340 of the resist layer 34, allowing the first electrically connecting pads 311a to be electrically connected to the first circuit layer 31a via the first conductive via 312 and the second circuit layer 31b to be electrically connected to the first circuit layer 31a via the second conductive via 313, and allowing the first electrically connecting pads 311a to be completely exposed from the dielectric layer 31 without having extending circuits.

Figure 3E:
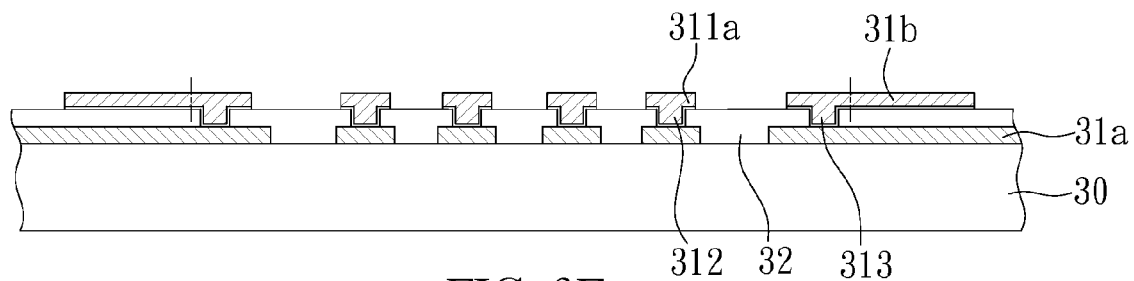

Referring to FIG. 3E, the resist layer 34 and the conductive layer 33 covered thereby are removed for exposing the second circuit layer 31b and the plurality of first electrically connecting pads 311a.

Figure 3F:
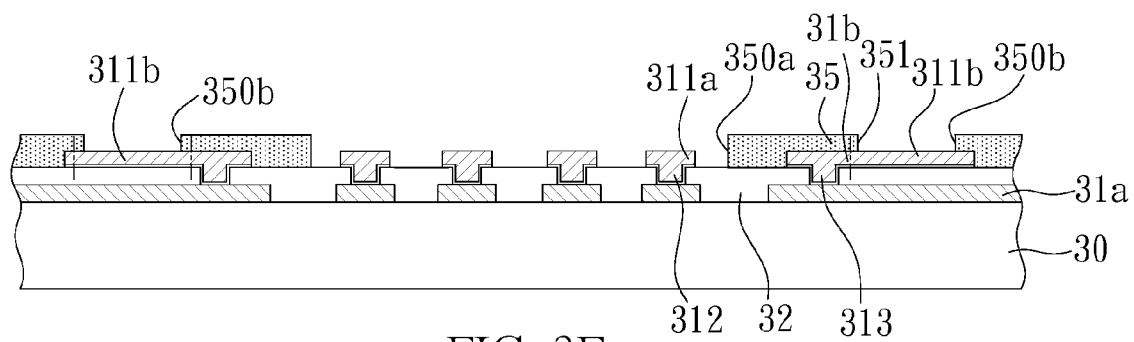

Referring to FIG. 3F, an insulative protective layer 35 such as a solder resist layer is formed on the main body 30. An opening 350a is formed in the insulative protective layer 35 to expose the first electrically connecting pads 311a. A plurality of insulative protective layer openings 350b are formed in the insulative protective layer 35 to expose a portion of the second circuit layer 31b. The exposed portion of the second circuit layer 31b functions as second electrically connecting pads 311b.

Figure 3G:
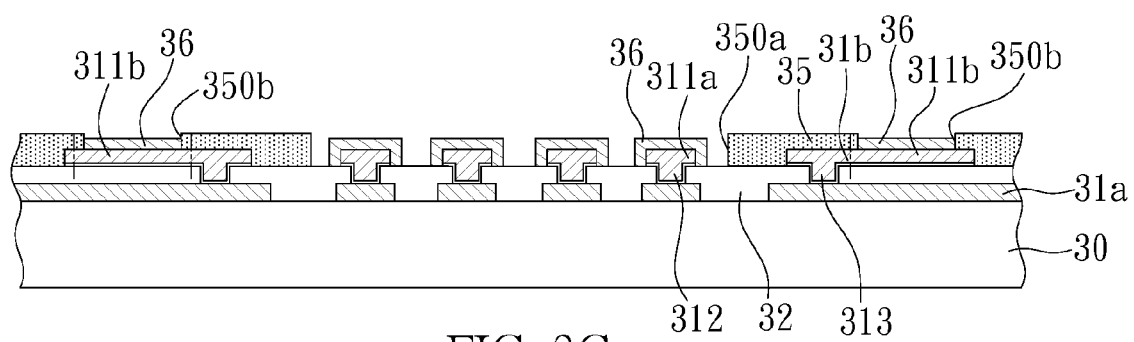
Figure 3G:
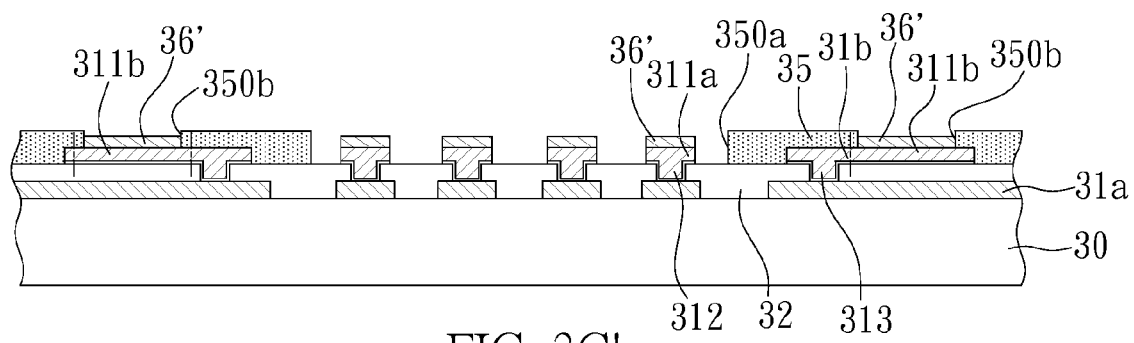

Referring to FIGS. 3G and 3G', an adhesive layer 36 made of immersion tin is formed on the first electrically connecting pads 311a and second electrically connecting pads 311b (as shown in FIG. 3G), or the adhesive layer 36 made of printed tin 36' is formed on the first electrically connecting pads 311a and second electrically connecting pads 311b (as shown in FIG. 3G').

Figure 4:
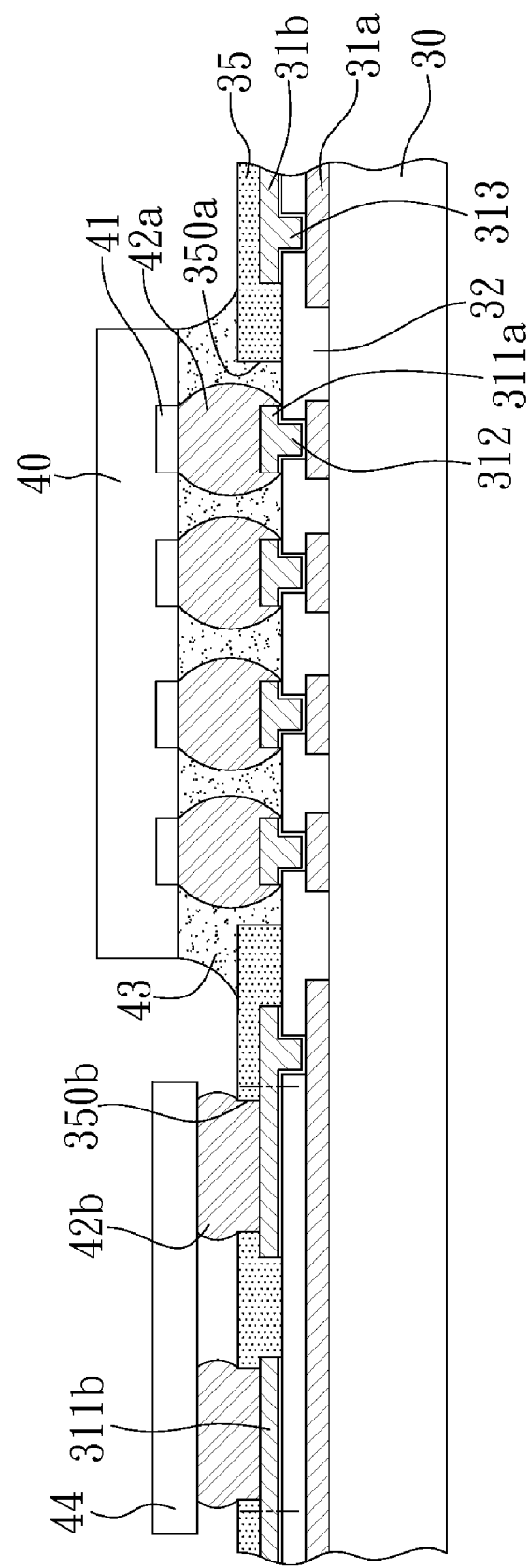
FIG. 4 is a cross-sectional view of the semiconductor package mounted with a semiconductor chip in accordance with the present invention.

Referring to FIG. 4, a semiconductor chip 40 is provided, in which the semiconductor chip has a plurality of electrode pads 41 having bumps 42a, each of which corresponds in position to the adhesive layer on the first electrically connecting pads 311a (as shown as the immersion tin 36 in FIG. 3G or printed tin 36' in FIG. 3G'), allowing the semiconductor chip 40 to be electrically connected to the first electrically connecting pads 311a, as well as allowing the bumps 42a and the adhesive layer to fuse together. Since the first electrically connecting pads 311a do not have extending circuit, the bumps 42a and the adhesive layer in fusion completely covers the top and side surfaces of the first electrically connecting pads 311a, so as to enhance the bonding strength between the bumps 42a and the first electrically connecting pads 311a, and avoid incomplete coverage which might otherwise result in stress concentration. Subsequently, the opening 350a of the insulative protective layer 35 is filled with an underfill 43 formed between the semiconductor chip and the dielectric layer 32. In addition, at least a passive component 44 is provided, which is electrically connected to the second electrically connecting pads 311b via the solder material 42b, for enhancing electrical functionality.

The present invention further provides a semiconductor package substrate, comprising: a main body with at least a surface having a first circuit layer 31a thereon and a dielectric layer 32 covering the first circuit layer 31a, and having a plurality of vias 320 on a portion of the first circuit layer 31a; a plurality of first electrically connecting pads 311a formed correspondingly on the first conductive vias 312 without having extending circuits for the semiconductor chip 40 to be mounted thereon, and electrically connected to the first circuit layer 31a via the first conductive vias 312; and an insulative protective layer 35 formed on the main body 30 and formed with an opening 350a for exposing the first electrically connecting pads 311a.

Accordingly, the foregoing structure further comprise an adhesive layer made of immersion tin 36 for completely covering the first electrically connecting pads 311a, or printed tin 36' formed on the first electrically connecting pads 311a. A second circuit layer 31b is formed on the first electrically connecting pad-formed surface of the main body 30. The second circuit layer 31b is electrically connected to the first circuit layer 31a via a plurality of second conductive vias 313 in the dielectric layer 32 and covered by the insulative protective layer 35. A conductive layer 33 is formed between the dielectric layer 32 of the main body 30 and the first electrical connection pads 311a, and between the vias 320 of the dielectric layer 32 and the first conductive vias 312.

Moreover, according to the foregoing structure, an adhesive layer is formed on the first electrically connecting pads 311a and electrically connected to the semiconductor chip 40. The semiconductor chip 40 has a plurality of electrode pads 41 having bumps 42a corresponding in position to the adhesive layer on the first electrically connecting pads 311a, allowing the bumps and the adhesive layer to fuse together. The opening 350a of the insulative protective layer 35 and the space between the semiconductor chip 40 and the dielectric layer 32 is filled with an underfill 43. In addition, at least one passive component 44 is electrically connected to the second electrically connecting pad 311b via the solder material 42b for enhancing electrical function.

Accordingly, the fabrication of the semiconductor package structure of the present invention involves forming first electrically connecting pads on the dielectric layer of the substrate body, using the first conductive vias in the dielectric layer to electrically connect with the first circuit layer, allowing the first electrically connecting pads to be completely exposed from the dielectric layer without having extending circuits, followed by a reflow process on the adhesive layer to allow the bumps of the semiconductor chip and the adhesive layer to fuse together and completely cover the first electrically connecting pads, so as to enhance the bonding strength between the semiconductor chip and the first electrically connecting pads, as well as to avoid incomplete coverage resulting in stress concentration. Moreover, since there is no circuits being disposed between the first electrically connecting pads, it is feasible to elevate the layout density of the first electrically connecting pads being disposed, thus is preferred for fine-pitch electrical connection.

The present invention has been described using exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package substrate, comprising:
a main body with at least a surface having a first circuit layer thereon and a dielectric layer covering the first circuit layer, wherein the dielectric layer has a plurality of vias formed on a portion of the first circuit layer;
a plurality of first conductive vias correspondingly positioned in the vias;
a plurality of first electrically connecting pads correspondingly positioned on the first conductive vias, completely exposed from the dielectric layer without having extending circuits, and electrically connected to the first circuit layer via the first conductive vias;
an adhesive layer formed on the first electrically connecting pads; and
an insulative protective layer formed on the dielectric layer of the main body and having an opening for completely exposing the adhesive layer formed on the first electrically connecting pads.

2. The semiconductor package substrate of claim 1, wherein the adhesive layer completely covers the immersion tin of the first electrically connecting pads or the printed tin on the first electrically connecting pads.

3. The semiconductor package substrate of claim 1, further comprising a semiconductor chip having a plurality of bumps corresponding in position to the first electrically connecting pads and electrically connected to the adhesive layer on the first electrically connecting pads, allowing the bumps and the adhesive layer to fuse together.

4. The semiconductor package substrate of claim 3, further comprising an underfill filled in the opening of the insulative protective layer and formed between the semiconductor chip and the dielectric layer.

5. The semiconductor package substrate of claim 1, further comprising a conductive layer formed between the dielectric layer of the main body and the first electrically connecting pads and between the vias of the dielectric layer and the first conductive vias.

6. The semiconductor package substrate of claim 1, wherein a first electrically connecting pad-formed surface of the main body further has a second circuit layer covered by the insulative protective layer, wherein the insulative protective layer has a plurality of openings to expose a portion of the second circuit layer functioning as second electrically connecting pads, and wherein the second circuit layer is electrically connected to the first circuit layer via the plurality of second conductive vias in the dielectric layer.

7. The semiconductor package substrate of claim 6, further comprising a conductive layer formed between the dielectric layer of the main body and the second circuit layer, and between the vias of the dielectric layer and the second conductive vias.

* * * * *